United States Patent [19]

O'Mara, Jr. et al.

[11] Patent Number: 5,027,187
[45] Date of Patent: Jun. 25, 1991

[54] POLYCRYSTALLINE SILICON OHMIC CONTACTS TO GROUP III-ARSENIDE COMPOUND SEMICONDUCTORS

[75] Inventors: William E. O'Mara, Jr., Kingston, N.H.; Gregory A. Schrantz, Melbourne, Fla.

[73] Assignee: Harris Corporation, Melbourne, Fla.

[21] Appl. No.: 608,622

[22] Filed: Nov. 6, 1990

Related U.S. Application Data

[63] Continuation of Ser. No. 497,187, Mar. 22, 1990, abandoned.

[51] Int. Cl.$^5$ ............... H01L 23/49; H01L 29/40; H01L 29/12; H01L 21/44
[52] U.S. Cl. ............... 357/65; 357/59; 357/88; 357/71; 437/186
[58] Field of Search ............... 357/67, 59, 71, 186

[56] References Cited

U.S. PATENT DOCUMENTS 4,519,127 5/1985 Arai ............... 357/65
4,908,691 3/1990 Silvestri et al. ............... 357/49

FOREIGN PATENT DOCUMENTS 0074541 3/1983 European Pat. Off. ............... 357/71
56-162873 12/1981 Japan ............... 357/71

OTHER PUBLICATIONS

"Diffusion of Silicon In Gallium Arsenide Using Rapid Thermal Processing: Experiment and Model", by Greinen et al.; American Institute of Physics—1984.
"The Diffusion of Silicon in Gallium Arsenide", by Antell; Solid-State Electronics, vol. 8, pp. 943-946, 1965.
"Semiconductors and Semimetals", by Willardson et al.; Academic Press, 1968.
"Study of Encapsulants for Annealing Si-Implanted GaAs", by Onuma et al.; 1982.
"Electron Microscope Studies of an Alloyed Au/-Ni/Au—Ge Ohmic Contact to GaAs", by Kian et al.; American Institute of Physics—1983.

Primary Examiner—Andrew J. James
Assistant Examiner—Cynthia S. Deal
Attorney, Agent, or Firm—Barnes & Thornburg

[57] ABSTRACT

A polycrystalline silicon layer forms an Ohmic contact to a group III-arsenide compound semiconductor substrate by heating the substrate. The polysilicon contact out-diffuses silicon into the substrate to form an N++ region.

4 Claims, 1 Drawing Sheet

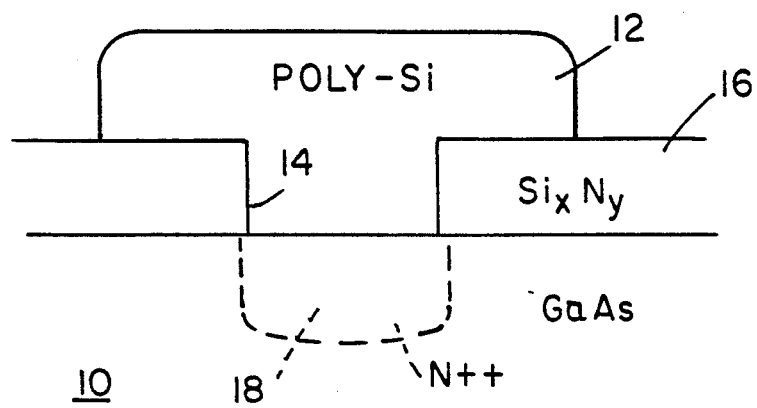

POLYCRYSTALLINE SILICON OHMIC CONTACTS TO GROUP III-ARSENIDE COMPOUND SEMICONDUCTORS

This is a continuation of application Ser. No. 07/497,187, filed March 22, 1990 now abandoned.

BACKGROUND AND SUMMARY OF THE INVENTION

The present invention relates generally to group III-arsenide binary or ternary compound semiconductor substrates and devices and more specifically to contact for these devices.

Semiconductor devices made with group III-arsenide alloys, for example gallium arsenide, have increased in their use. Presently ohmic contacts to gallium arsenide substrates or devices use a gold-germanium alloyed contact. These contacts start to degrade in an unpredictable manner when processing temperatures exceed 400° centigrade. Alloying also produces pitted metal/GaAs interfaces which can give rise to high field regions, current crowding with associated local joule heating, enhanced electromigration, and eventual device failure. This places a substantial restriction on the final processing steps, including packaging and die attachment.

Thus it is an object of the present invention to provide an ohmic contact structure to group III-arsenide substrates which does not restrict the final processing and packaging temperatures.

These and other objects are obtained by using polycrystalline silicon as the contact to regions of a group III-arsenide substrate. The substrate may be gallium arsenide or other group III-arsenide compound semiconductor. A heavily doped N type contact region is formed in the N type substrate region by heating the device sufficiently to out-diffuse silicon impurities from the polycrystalline silicon contact into the N type region. The N type region may be sources or drains of field effect transistors. The process of formation includes forming an opening in an insulative material, which may be silicon nitride, silicon dioxide or tantalum oxide and applying the polycrystalline silicon contact material into the opening. The heating of the substrate will diffuse silicon from the contact material into the substrate to form the heavily doped N type contact region.

Other objects, advantages and novel features of the present invention will become apparent from the following detailed description of the invention when considered in conjunction with the accompanying drawings.

BRIEF DESCRIPTION OF THE DRAWING

The FIGURE is a cross-sectional view of an ohmic incorporating the principles of the present invention.

DETAILED DESCRIPTION OF THE DRAWING

A group III-arsenide substrate 10 for example gallium arsenide, having an N conductivity type region therein, includes an ohmic contact 12 of polycrystalline silicon. The contact 12 extends through an opening 14 in an insulative layer 16, which may be silicon nitride. Depending upon the processing steps, a highly doped N++ contact region 18 is formed in the substrate 10 by out-diffusion of silicon impurities from the polycrystalline silicon contact layer 12 in the substrate 10. This forms an ohmic contact with the gallium arsenide substrate.

The group III-arsenide substrate may be selected from the group of gallium arsenide, aluminum gallium arsenide, gallium indium arsenide, and aluminum indium arsenide. The region 10 of the substrate may be a source or drain of field effect transistors or any other active or passive device. The polycrystalline silicon layer 12 is stable up to temperatures in the range of 1000° C. which is well above the anticipated processing temperatures for the final processing, packaging and die attachment which generally do not exceed 350° C.

The process for forming the ohmic contact includes forming an opening 14 in the insulative layer 16 and applying a layer of polycrystalline silicon. This may be applied by photo-enhanced chemical vapor deposition, laser-induced chemical vapor deposition, plasma-enhanced chemical vapor deposition, or low-pressure chemical vapor deposition. The layer is then patterned to form the ohmic contact 12. A special heating step may be performed to diffuse silicon from the polycrystalline silicon layer 12 into the substrate 10. In a typical example, the substrate 10 may have a background impurity concentration range $5 \times 10^{15}$ cm$^{-3}$ to $5 \times 10^{17}$ cm$^{-3}$. The high impurity region contact 18 may be formed by heating the substrate at a temperature in the range of 750° C. to 900° C. for a period of 5 seconds to 60 seconds to produce an impurity concentration in the range of $1 \times 10^{18}$ cm$^{-3}$ to $1 \times 10^{19}$ cm$^{-3}$.

The process for forming N++ regions in the gallium arsenide substrate 10 may also be used wherein the substrate region 10 is a P conductivity type and therefore forms a PN junction between regions 18 and 10.

Although the process has been described as forming N++ regions in a gallium arsenide substrate, if the final processing and packaging temperatures are below 700° C., very little if any, out-diffusion from the polycrystalline silicon layer contact 12 will result and therefore the polycrystalline silicon 12 may be used as a contact to any region of the gallium arsenide substrate 10.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A contact structure for group III-arsenide substrate comprising:
   a group III-arsenide substrate having a first region of a first impurity concentration;
   a contact region in said first region having silicon impurities of a greater impurity concentration than said first impurity concentration; and
   a polycrystalline silicon contact on a surface of said first region of said substrate forming an ohmic contact with said contact region.

2. A contact structure according to claim 1, wherein said first region is of an N conductivity type.

3. A contact structure according to claim 1, wherein said first region is of a P conductivity type.

4. A contact structure according to claim 1 wherein said group III-arsenide substrate is selected from the group of binary or ternary compounds including gallium arsenide, aluminum gallium arsenide, gallium indium arsenide, and aluminum indium arsenide.

* * * * *